United States Patent [19]

Berger et al.

[11] 4,412,312

[45] Oct. 25, 1983

[54] MULTIADDRESSABLE HIGHLY INTEGRATED SEMICONDUCTOR STORAGE

[75] Inventors: Horst H. Berger, Sindelfingen; Siegfried K. Wiedmann, Stuttgart, both of Fed. Rep. of Germany

[73] Assignee: International Business Machines Corporation, Armonk, N.Y.

[21] Appl. No.: 317,045

[22] Filed: Nov. 2, 1981

[30] Foreign Application Priority Data

Nov. 26, 1980 [EP] European Pat. Off. ...... 80 10 7368.5

[51] Int. Cl.³ .............................................. G11C 7/00
[52] U.S. Cl. ................................... 365/189; 365/190; 365/230
[58] Field of Search ............... 365/154, 156, 189, 190, 365/230, 168

[56] References Cited

U.S. PATENT DOCUMENTS

| 3,651,476 | 3/1972 | Metz et al. | |
|---|---|---|---|
| 3,737,866 | 6/1973 | Gruner | 235/153 |
| 3,968,480 | 7/1976 | Stein | 365/154 |
| 3,979,735 | 9/1976 | Payne | 365/154 |
| 4,070,657 | 1/1978 | Fett | 365/233 |
| 4,125,877 | 11/1978 | Reinert | 365/190 |
| 4,127,899 | 11/1978 | Dachtera | 365/154 |
| 4,193,127 | 3/1980 | Gersbach | 365/174 |
| 4,280,197 | 7/1981 | Schlig | 365/154 |

FOREIGN PATENT DOCUMENTS 2357979 2/1978 France.

OTHER PUBLICATIONS

Joy et al., "Multi-Port Asymmetrical Memory Cell," IBM Tech. Disc. Bul., vol. 23, No. 7A, 12/80, p. 2822.
Catt et al. "A High-Speed Integrated Circuit Scratchpad Memory," Proceedings-Fall Joint Computer Conf., vol. 29, pp. 315-331, 11/7-10/66.
Reinert et al., "A 32x9 ECL Dual Address Register Using an Interleaving Cell Technique," IEEE 5SSCC 77, 2/16/77, pp. 72-73.
Cretelli et al., "Dual Schottky Diode Cell," IBM Tech. Disc. Bul., vol. 22, No. 4, 9/79, pp. 1489-1492.
Cavaliere et al., "Memory Cell Adapted for Different Combinations of Simultaneous Read and Write Operations," IBM Tech. Disc. Bul., vol. 23, No. 1, 6/80, pp. 180-186.
Stopper et al., "Eine Integrierte Schaltung zur Realiserung eines Halbleiterspeichers," Proc. of the IFAC-/IFIP Symp., 10/21-23/65, pp. 259-273.
Dennison et al., "Multi-Port Array Cell," IBM Tech. Disc. Bul., vol. 22, No. 10, 3/80, pp. 4553-4554.
Chang, "Multiple-Read Single-Write Memory and Its Applications," IEEE Trans. on Computers, vol. C-29, No. 8, 8/80, pp. 689-694.
Price, "Simultaneous Access Memory," IBM Tech. Disc. Bul., vol. 23, No. 2, 7/80, pp. 657-658.

Primary Examiner—Stuart N. Hecker
Attorney, Agent, or Firm—J. C. Redmond, Jr.

[57] ABSTRACT

A multiaddressable highly integrated semiconductor storage is provided, the storage locations of which are addressable by several independent address systems for parallel reading and/or writing. The storage locations are each made up of n storage elements. One storage location consists, for example, of at least two flip-flops which, via coupling elements are connected to associated separate bit and word lines. Each storage location has at least three independently selectable or addressable entry/exit ports permitting the following operations to be executed in parallel: Read word A, read word B, write word C as well as any combination of two or individual ones of those operations. The number of read ports can be increased by providing further address systems and by substituting triple, quadruple, etc., storage cells for a cell pair.

8 Claims, 7 Drawing Figures

MULTIADDRESSABLE HIGHLY INTEGRATED SEMICONDUCTOR STORAGE

BACKGROUND OF THE INVENTION

The invention concerns a multiaddressable highly integrated semiconductor storage, whose storage cells are located at the crossings of word and bit lines and which are addressable by several independent address systems for parallel reading and/or writing.

Storages permitting the parallel reading of two stored words or the simultaneous reading of a particular stored word and the writing of another word into another storage location are known in principle.

A semiconductor storage permitting two or more word lines to be simultaneously addressed is described in DE-OS No. 2 327 062. However, this storage has the disadvantage that the words read are not simultaneously available at the storage output but are combined in the storage to form a logical product. The simultaneous writing of a word into other storage locations is not possible.

Known from U.S. Pat. No. 3 675 218 is furthermore a storage arrangement, wherein information can be written into any random part, while information is read from another part different from the first. Although this solution is technically elaborate, it only permits writing one word and simultaneously reading another. In IBM TDB, Vol. 19, No. 7, December 1976, a storage organization is described permitting the parallel reading of two stored words. From IEEE 1977, "International Solid State Circuit Conference", Feb. 16, 1977, pages 72 and 73, a 32×9 ECL dual address register is known permitting two separate parallel read operations of stored words. Besides the apparent access port restrictions the technical means required is the prior art for sensing and selection as well as writing are relatively elaborate and do not permit optimum integration.

The previously described storages, which are addressable in parallel, have the common disadvantage that, unless additional registers or storages are provided, they are not suited for use as high-speed storages in advanced processors. Up-to-date processors comprise, as a rule, high-speed registers, the operation of which is partly concealed and which are partly available to the programmer. With many instructions, two operands are to be read from two different registers and to be fed to the arithmetic unit for processing; the result of this arithmetic operation is stored in one of the registers. In such a known processor, an instruction is executed as follows:

1. Reading two operands from different registers,
2. executing an arithmetical operation, such as an addition, subtraction or multiplication, and
3. feeding the result to one of the registers, i.e., the result is written into one of the registers.

In addition, it is frequently necessary to find a time gap in which other new information, for example, from main storage, can be written into one of the registers. With the storages known so far, which permit addressing only one word or which permit parallel addressing only for reading two words, such operations can only be performed in series or partly in parallel. As a result, storage times accumulate which essentially influence the speed at which an instruction can be executed. To speed up operation, it would be desirable to have a storage, whose ports to the individual registers can be used in parallel, i.e., in the present case to have at least three ports, one read port for each operand and a write port for the result. For addressing these ports to the registers, each of them is provided with an independent address decoder. As described, register banks with two ports are known from the above-mentioned literature (IEEE 1977). In highly integrated semiconductor technology, in particular bipolar technology, it is relatively difficult and expensive to manage with only one storage cell per bit. In accordance with the two address systems, two cells are generally used for each bit. But these cells must always contain the same information. Care must be taken that information written by an address system into one cell of the pair also reaches the other cell of the pair. In the above-mentioned prior art citation, this is accomplished by coupling the cell pairs in the standby state, i.e., it is only after a cell has been written and is about to assume the standby state, that the coupling impresses the same information into the other cell of the pair. This storage has no third port.

It is the object of the invention to provide a highly integrated semiconductor storage which has at least three ports with independent address decoders which is capable of executing in parallel at least three operations, such as reading a word A, reading a word B and writing a word C, as well as any arbitrary combination of two or individual ones of the three operations, and which eliminates the usual storage and register heirarchy in the processors.

SUMMARY OF THE INVENTION

In accordance with the invention the storage locations are being made up of at least two storage elements which, via coupling elements, are connected to associated but different bit lines as well as to separate word lines, and which have at least three independently selectable ports. The coupling elements respond to different polarities of changes in the reference potential of the storage elements. According to one embodiment one such element of a storage location is addressable via first address and read lines, with the other element of the same storage location being separately addressable via second address and read lines. The write operation for both storage elements of a storage location is controlled by at least a third port by having the two storage elements of a storage location being connected to common or coupled write (access) lines.

By providing a third port to each storage cell and by using double or multiple cells for a word organized storage matrix it is possible to read two or more operands in parallel and to write the result into the same storage immediately afterwards, without buffer registers or other auxiliary means being required. Compared to the storages known so far, the double or multiple cell structure has the advantage that despite the additional ports, integration is considerably improved and far higher. The write and read selection by means of the coupling elements permits the cells to respond to different polarities of changes in the reference potential, so that the read and write speeds of the cells can be separately optimized. In addition, it is technically very simple to further increase the number of read ports by providing, for instance, further address circuitry and triple and quadruple storage cells, etc.

BRIEF DESCRIPTION OF THE DRAWINGS

The invention will be described in detail below with reference to drawings which illustrate embodiments, in which.

DETAILED DESCRITPION OF THE INVENTION

Figure 1:
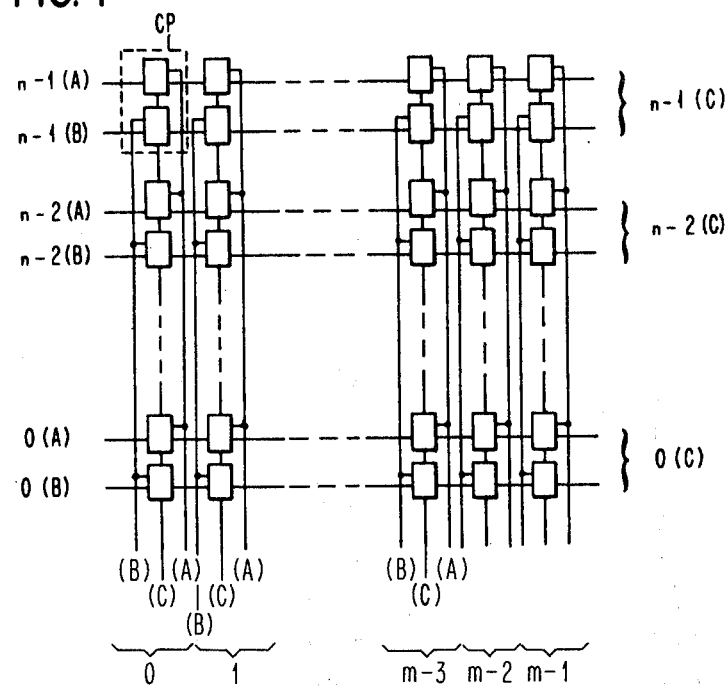
FIG. 1 shows a typical arrangement schematic of the cell pairs within a storage matrix.

FIG. 1 shows a section of a storage matrix, at the word and bit line crossings of which storage cells are located and wherein two storage cells form a cell pair CP for storing one bit. This storage has three entry/exit ports (A), (B) and (C), thus permitting the following storage operations to be executed in parallel:

read A, read B, write C as well as any arbitrary combination of two of the three operations or any one of them.

Each storage location is formed by a cell pair CP, of which for a reading operation one cell is associated with address system A and the other cell with address system B. The two storage cells forming the cell pair CP are jointly associated with the address system C, i.e., in this embodiment writing is effected in parallel, whereas the storage ports (A) and (B) serve to separately read stored information. The cell pair CP consisting of two flip-flops has only been chosen for the present embodiment. Instead of the two flip-flops forming one storage cell each, other configurations of several storage elements, such as a dynamic one-FET cell, are equally conceivable. If there are three storage elements for each storage location, three read lines are linked with the three storage elements by means of coupling elements.

Logically, the same information is written into all, in this case 3, storage elements. Physically, it may be advantageous to subdivide the common write line into two or more lines, so that, for example, the storage elements of the storage locations can be implemented in physically separate matrices.

For simplicity's sake the address decoders have been omitted in the drawing, but it is pointed out that each port of the storage has its own address decoder, whose design is similar to that of the known address decoders. If a register in the storage of FIG. 1 is addressed by the (not shown) address decoder belonging to port (A), then only the cells of the bit cell pairs CP, which belong to the word line connected to port (A), are selected. In the present case, these are the registers n - 1 (A), n - 2 (A), . . . . In addition, the vertical bit line outputs designated as (A) are activated. However, it is possible to simultaneously select via port (B) a word line connected thereto which may even have the same address as said port. In the latter case the bit line exit ports (B) are additionally activated.

For writing information into the storage in accordance with this embodiment, only one bit port (C) is available for each cell pair CP, and also the word lines of an address are addressed jointly, so that the two cells of a cell pair CP are bound to have the same information status.

In another embodiment described in detail further below, it is shown that it is possible to write a word via port (C), while reading one or two other words independently thereof via ports (A) or (B). It is generally not necessary to simultaneously read and write the same storage cells. A coincidence of addresses A and C or B and C indicates that information is directly available outside the storage, namely, at port C.

Figure 2:
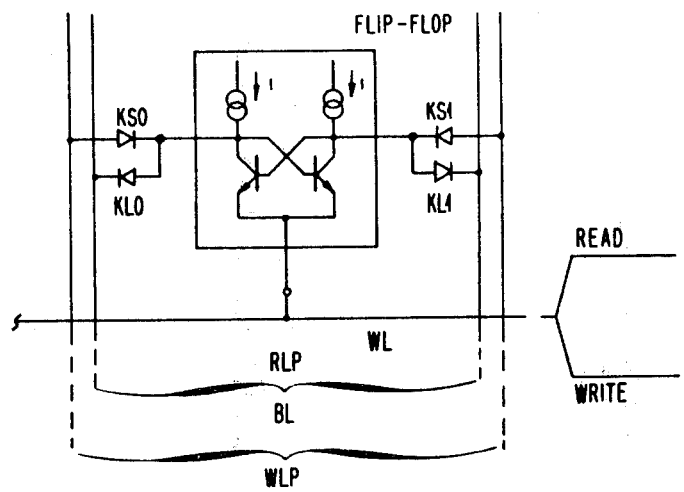
FIG. 2 shows a circuit diagram of a storage cell of a pair with coupling diodes.

In FIG. 2, of a cell pair CP, only one cell is illustrated which essentially consists of a flip-flop known per se. The bit line coupling elements KL0/KL1 and KS0/KS1 with different forward directions permit distinguishing between write and read selection at the word line WL. FIG. 2 shows that the coupling elements KL0, KL1 for a read function become conducting when the reference potential of the storage cell on the word line WL is raised. This leads to this storage cell being selected in a known manner, while the other cells (not shown) belonging to the same bit are not selected, because their reference potential is more negative, since their read coupling elements are inhibited. This means that a still more negative potential at one of the remaining cells of this bit line RLP does not interfere with this read selection.

However, this more negative potential at one of the other word lines, (not shown), turns on the write coupling elements corresponding to KS0 or KS1, so that information can be selectively written into that cell, while the other cell is read via the other bit line pair WLP. A reversal of the forward directions of the diodes and thus a reversal of the polarity of the write and read word lines is also possible without departing from the concept of the invention.

Figure 3:
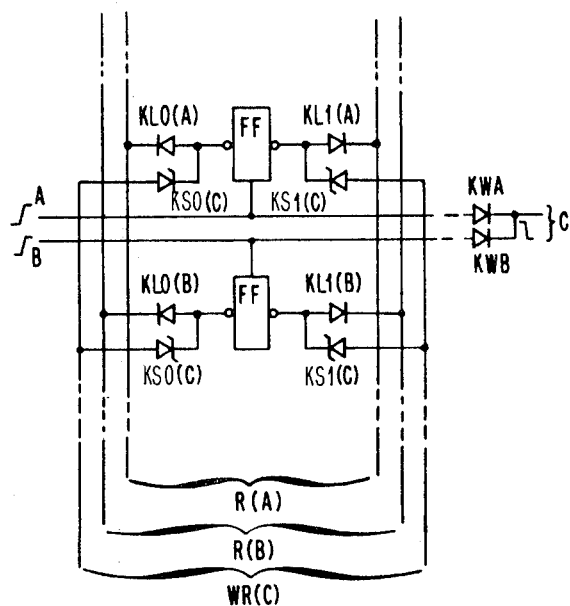
FIG. 3 shows an arrangement of two storage cells within the storage system.

Parallel reading of two words is achieved by duplicating the cells of each bit and by assigning to each cell its own entry port system (word and read bit lines). As described earlier on, there is only one write port (C) in this case, i.e., both cell flip-flops FF of the cell pair illustrated in FIG. 3 are simultaneously written via the coupling, represented in principle by the diodes KWA and KWB, of the two word lines A and B and via the common write lines WR (C). It is pointed out, however, that it is quite possible to simultaneously read another word via the (A) or the (B) port. But any coincidence between the A or B address and a C address must be avoided in the present embodiment. This is achieved by assigning priority to the C address, for example. Priority control may be effected either logically from the outside or in storage by a C selection, for example, switching off the respective A or B selections. As conventional circuits of this type are readily available from the art, a more detailed description need not be given at this point.

In addition, it is possible to sense the coincidence of the C and A or the C and B addresses at the decoder outputs, thus triggering a control signal which switches the (C) entry port to the (A) or the (B) exit port.

Figure 4:
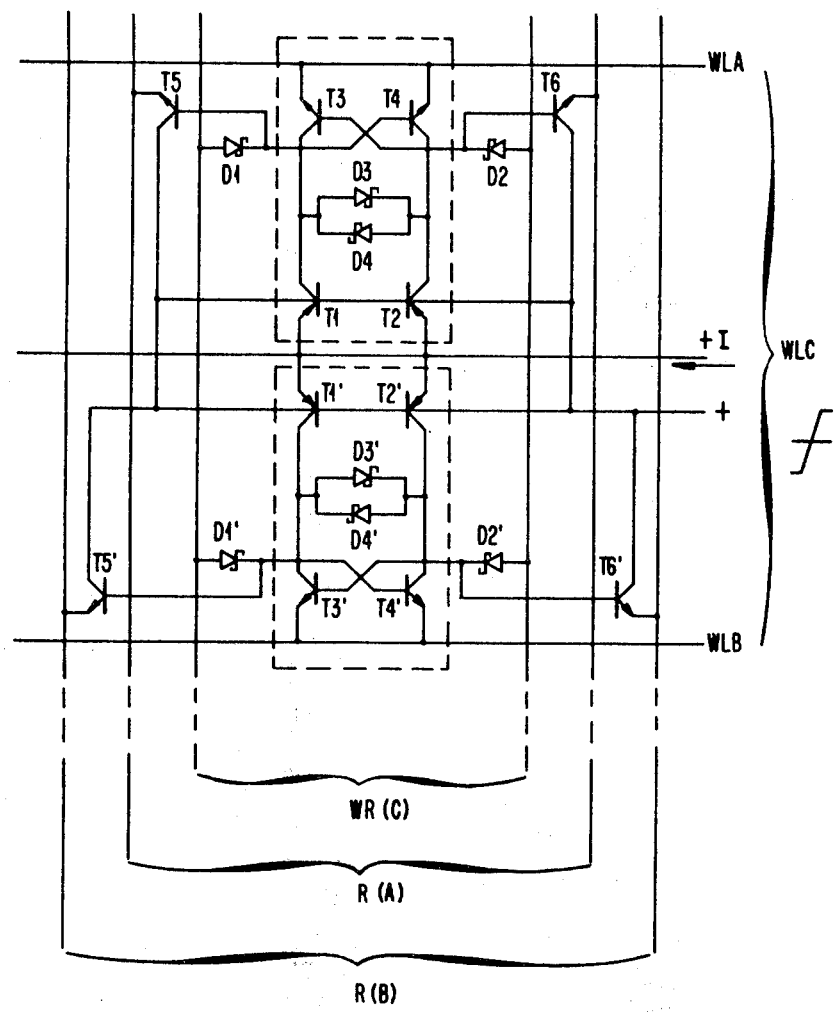
FIG. 4 shows a particularly favorable circuit diagram of the storage cells illustrated in FIGS. 1 and 2, and FIGS. 5, 5A, 5B show in plan and sectional views a layout of a double cell permitting the parallel reading of two words and the writing of a further word.

A particularly advantageous circuit diagram of the cells shown in principle in FIGS. 1 to 3 is illustrated in greater detail in FIG. 4. The two flip-flops of FIG. 3 are indicated surrounded by broken lines. These two flip-flops are made up of PNP transistors T1, T2 and T1', T2', respectively, serving as current sources. The cross-coupled NPN transistors T3, T4 and T3', T4', respectively, may be provided in a known manner with Schottky clamp elements which are represented by Schottky diodes D3 and D4 and which accelerate the write process. In this embodiment Schottky diodes D1, D2 and D1', D2', respectively, are used as coupling elements for the write bit lines WRC. However, as read coupling elements transistors T5, T6 and T5', T6', respectively, are best used whose current amplification leads to a stronger read signal. The two bit line pairs R (A) and R (B) are coupled to the cells that way. Word line C corresponds to that shown in FIG. 3 and is also subdivided into the lines A and B. The selection of the individual cells corresponds to that described in connection with FIGS. 1 to 3, so that a selection example need not be described here.

Figure 5:
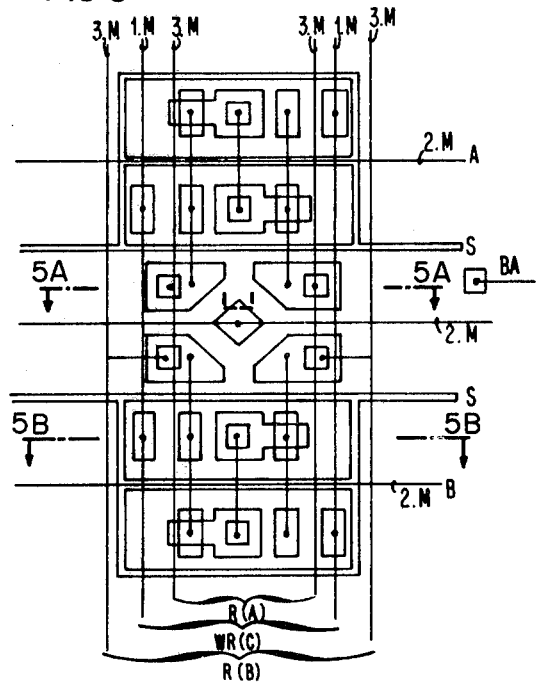

FIG. 5 shows the double cell structure in accordance with the invention in bipolar technology. In this context, the cell structure and a triple metallization on a chip are assumed to be known. In FIG. 5, these three metallization layers are diagrammatically represented as 1.M to 3.M. Compared to a single metallization, this triple metallization reduces the cell width considerably.

Figure 5A:
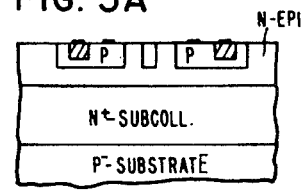
Figure 5B:
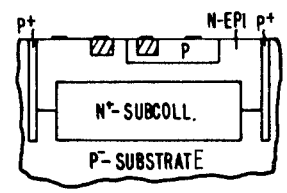

According to FIGS. 1 to 4, the bit line pairs are designated as R (A), R (B) and WR (C), with which they comply in full. The two word lines A and B according to FIG. 3 are also shown clearly in FIG. 5. To convey a better idea of the semiconductor structure of the actual cell, two sectional views are shown in FIGS. 5A, 5B. As these sectional views are self-explanatory, a more detailed description has been omitted. One metallization plane is advantageously associated with each port (A), (B) and (C).

By means of the double cell arrangement shown in FIGS. 1 to 5 in a word organized storage matrix, it is thus possible in each case to read one of the double cells via address and read lines of one port and the other, separately therefrom, via second address and read lines of a second port, whereas writing is effected via a third port by means of a write or address line common or coupled to the cells of a storage cell pair CP. Further, write and read selection is effected via coupling elements which respond to the different polarities of changes in the reference potential of the cells, so that the write and read operation speeds of the storage cells can be separately optimized.

While the invention has been particularly shown and described with reference to the preferred embodiments thereof, it will be understood by those skilled in the art that various changes in form and detail may be made therein without departing from the spirit and scope of the invention.

What is claimed is:

1. A multiaddressable storage comprising a plurality of intersecting bit and word lines forming crosspoints therebetween, a plurality of storage locations provided at the crosspoints and connected to said respective bit and word lines, said storage locations each consisting of at least a cell pair of two storage elements, and coupling elements for connecting the storage elements to associated bit lines differing from each other and to separate word lines, whereby each storage location is provided with at least three independently selectable read/write ports.

2. The multiaddressable storage of claim 1, in which the coupling elements are responsive to different polarities of a reference potential applied to the storage location, wherein further from the at least two storage elements of a storage location one storage element is addressable via first address and read lines while the other storage element of the same storage location is addressable separately therefrom via second address and read lines for reading and wherein the write operation for both storage elements of a storage location or cell pair is controllable via at least a third port by having the at least two storage elements of a storage location connected to third common or coupled address or write lines.

3. The multiaddressable storage of claims 1 or 2, in which the number of read ports is increased by providing the storage locations as triple, quadruple, etc., storage cells with corresponding additional address circuitry.

4. The multiaddressable storage of claims 1 or 2 wherein the cell pairs connected to a word line pair form register banks which are separately addressable via separate word lines and which emit their information via separate bit line pairs, and wherein for writing information into the storage, all cell pairs belonging to a register bank are jointly addressable from a third port via said two separate words lines.

5. The multiaddressable storage of claim 1 in which for executing in parallel the operations "read word A", "read word B" and "write word C" as well as any combination of two or individual ones of the three operations, a cell pair is provided with corresponding separate first, second and third ports.

6. The multiaddressable storage of claim 5, wherein the third port for writing information into a storage location is connected via associated coupling elements to the word lines of said storage location so that the at least two storage elements of said storage location are simultaneously addressed via the word lines and the common write lines.

7. The multiaddressable storage of claim 1 or 5 whereby, in an integrated semiconductor structure wtih multi-layer metallization the read ports in common are arranged in a first metallization layer with the common write port being arranged in a second metallization layer and where the word lines are arranged together and being formed of a third metallization layer.

8. The multiaddressable storage of claims 1 or 6, wherein the at least two storage elements forming each of the plurality of storage locations are physically arranged in separate storage matrices which are logically connected to each other via coupling elements.

* * * * *